United States Patent
Lee

[11] Patent Number: 6,090,726
[45] Date of Patent: Jul. 18, 2000

[54] PRETREATMENT METHOD OF A SILICON WAFER USING NITRIC ACID

[75] Inventor: Ming-Kwei Lee, Kaohsiung, Taiwan

[73] Assignee: National Science Council, Taipei, Taiwan

[21] Appl. No.: 09/093,072

[22] Filed: Jun. 8, 1998

Related U.S. Application Data

[63] Continuation-in-part of application No. 08/676,001, Jul. 5, 1996, abandoned.

[51] Int. Cl.[7] .............................. H01L 21/02; B05D 3/10
[52] U.S. Cl. .......................... 438/787; 438/905; 427/299; 427/309
[58] Field of Search .................... 427/299, 307, 427/309; 438/787, 905

[56] References Cited

U.S. PATENT DOCUMENTS

| | | | |
|---|---|---|---|
| 4,050,083 | 9/1977 | Jaskolski et al. | 357/28 |
| 4,261,791 | 4/1981 | Shwartzman | 156/628 |
| 4,375,125 | 3/1983 | Byatt | 29/588 |
| 4,956,022 | 9/1990 | Mahmoud | 134/41 |
| 5,066,359 | 11/1991 | Chiou | 156/651 |
| 5,131,546 | 7/1992 | Kodera | 211/41 |
| 5,462,898 | 10/1995 | Chen et al. | 437/235 |
| 5,529,946 | 6/1996 | Hong | 437/52 |
| 5,651,900 | 7/1997 | Keller et al. | 216/56 |
| 5,849,625 | 12/1998 | Hsue et al. | 438/424 |

*Primary Examiner*—Diana Dudash
*Assistant Examiner*—Michael Barr
*Attorney, Agent, or Firm*—Birch, Stewart, Kolasch & Birch, LLP

[57] ABSTRACT

LPD (Liquid Phase Oxide Deposition) technology is a newly developed approach to deposit $SiO_2$ on silicon wafers. LPD-$SO_2$ film was deposited by immersing the wafer in hydrofluosilicic acid ($H_2SiF_6$) solution supersaturated with silica gel at low temperature (about 40° C.). LPD-$SiO_2$, also the deformation of wafers is avoided so the method can be applied to the fabrication of integrated circuits. Moreover, this method has high potential to replace the CVD-$SiO_2$. However, it is very hard to deposit LPD-$SiO_2$ on very clean silicon wafer (e.g., without any oxide) because of no nucleation seed. In this study, the LPD-$SiO_2$ was deposited on silicon wafer with a plasma-enhanced chemical vapor deposition oxide, a thermal oxide, an atmospheric pressure chemical vapor deposition oxide, and a nitric acid pretreatment oxide. The nitric acid pretreatment enhances the LPD-$SiO_2$ growth rate and reduce the stress in the LPD-$SiO_2$ film. In addition, it has a smaller dielectric constant and it can reduce the parasitic capacitance in integrated circuits.

6 Claims, 5 Drawing Sheets

AVG = 1827 Å
STD = 17Å

AVG = 1.431
STD = 0.001

PRETREATMENT METHOD OF A SILICON WAFER USING NITRIC ACID

This is a continuation-in-part application of U.S. application Ser. No. 08/676,001 abandoned which is relied on and incorporated herein by reference in its entirety.

Traditionally, there are three methods used to grow $SiO_2$: Thermal Oxide, CVD (Chemical Vapor Deposition) and PECVD (Plasma Enhanced CVD). However, these techniques show inevitable disadvantages in practical application. For example, in the Thermal Oxide method, the high temperature needed throughout the oxidation process may easily cause wafer deformation and the destruction of the device's structure. CVD and PECVD require the temperature and the pressure to be in a range from 200° C. to 950° C., 1 atm. to 0.05 Torr. These pressure and temperature demands cause very complicated production processes and very high-cost equipment.

LPD (Liquid Phase Oxide Deposition) techniques are newly developed approaches to growing $SiO_2$ film. In this method, LPD $SiO_2$ film was deposited by immersing the wafer in hydrofluosilicic acid ($H_2SiF_6$) solution supersaturated with silica at a low temperature (about 40° C.). This technique can obtain a more uniform and denser LPD-$SiO_2$ film. Therefore, there is a strong potential to replace the traditional techniques in the production of ICs, such as the fabrication of CMOS devices. But it is very difficult to grow deposited $SiO_2$ without an oxide film as seed on the surface of a wafer.

BACKGROUND OF THE INVENTION

The processes of LPD technology use the following chemical formulae:

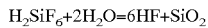
$$H_2SiF_6+2H_2O=6HF+SiO_2$$

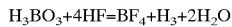
$$H_3BO_3+4HF=BF_4+H_3+2H_2O$$

at 40° C. or lower temperature

A. The advantages of LPD-$SiO_2$ are as follows:
 (1) The equipment used for LPD is simpler and cheaper than that of a vacuum system and also can be used on larger wafers to grow $SiO_2$.
 (2) The growth conditions can be easily controlled.
 (3) The growth temperature is lower than that of thermal Oxide or CVD. This advantage can help maintain the complete structure of the chip and the features of the devices.
 (4) There is low thermal stress and good gap fill capability.
 (5) There is less leakage of current density.
 (6) There is high dielectric breakdown strength.
 (7) Using the film can simplify the production process, lower the cost, and enhance packing density when applied in the integration of the production process.
 (8) the optionally to photoresist.

B. The applications of LPD-$SiO_2$ in the manufacturing process of integrated circuits are:
 (1) a "Mask" material to prevent the expansion and distribution of impurities,
 (2) insulator between devices, e.g., field oxide or trench isolation,
 (3) dielectrics between multi-metal layers,
 (4) VIA formation,
 (5) as single "Mask" to finish twin retrograde well structure of CMOS,
 (6) LDD (Light Doped Drain) oxide spacer width design.

DETAILED DESCRIPTION

Among those applications stated above, some LPD-$SiO_2$ films are processed on $SiO_2$, and some are processed on Si. However, it is very hard to deposit LPD-$SiO_2$ on very clean silicon wafers because of the lack of a nucleation seed. In this invention, the silicon wafer pretreated with nitric acid can easily be deposited by $SiO_2$, and the temperature throughout the process can be controlled to below 70° C. In comparison with the $SiO_2$ obtained by the methods of PECVD, thermal oxide, CVD, and LPD without pretreatment by nitric acid, it is found that the LPD with pretreatment by nitric acid can enhance the growth rate of LPD-$SiO_2$. In addition, the stress is reduced in the LPD-$SiO_2$ film and such film has a smaller dielectric constant and is very uniform.

TECHNICAL FIELD OF THE INVENTION

Due to greater functional requirements, integrated circuits are more complicated. These new trends include increasing the number of transistors, decreasing the size of wafers, and making new structures, such as multilayered metal structures and trench structures. These new trends bring about new subject areas such as flatness, low-temperature processes of IC, and so forth.

To meet these functional requirements, LPD, a new technique which can grow $SiO_2$ film at low temperature, is invented. Among many applications in the production process of integrated circuits, some films can be processed on the wafers which already have deposited $SiO_2$ on them, such as the deposition of a second layer in a multilayered metal structure. However, most applications, such as trench isolation, VIA formation, and multilayered structure, require direct deposition onto the Si wafer.

But, it is very difficult to process LPD on a very clean Si wafer because of the lack of a nucleation seed. To overcome this disadvantage, the pretreatment method of silicon wafer by nitric acid in the present invention controls the whole production process at a low temperature. The pre-treated silicon wafer can provide a nucleation seed for which growth is required. Additionally, the low processing temperature, which is a very important feature of this invention, can make the IC production process more flexible.

In this invention, the pretreatment method of silicon wafer by nitric acid is used to assist in the deposition of $SiO_2$ on the surface of wafers. When compared with the film grown by the methods of PECVD (Plasma Enhanced, CVD), Thermal Oxide, and CVD (Chemical Vapor Deposition), the film deposited by the LPD technique with the nitric acid pre-treatment method possesses lower internal stress, a smaller dielectric constant and greater uniformity. Also, the invention proves that the nitric acid pretreatment method can enhance the growth rate of LPD-$SiO_2$.

The flow process of the invention is as follows: First, a silicon wafer is placed a trich loroethylene (TCE) solution and agitated with an ultrasonic wave for five minutes. After the wafer is cleansed with deionized water (18 MΩ/cm), the wafer is placed in thick or concentrated sulfuric acid solution and boiled for 10 minutes. Next, the wafer is cleansed again with deionized water (18 MΩ/cm) and then immersed in the thick or concentrated nitric acid solution and heated for 10 minutes. Again, the wafer is cleansed with deionized water and put in hydrofluoric acid solution (HF:H$_2$O=1:10) for one minute. Then, the wafer is cleansed with deionized water one more time and put in the thick or concentrated nitric acid solution, then heated for 3 minutes at 62° C., and cleansed again with deionized water. After finishing these steps, the managed silicon wafer can be put in the LPD growth tank to grow. (The terms "thick" and "concentrated" are represented by the same Chinese character and therefore are synonymous.)

Five samples, a silicon wafer pretreated with nitric acid, a silicon wafer without pretreatment with nitric acid, a wafer having a thermal oxide film, a wafer having a PECVD oxide film, and a silicon wafer having a APCVD oxide, are respectively processed with LPD-SiO$_2$. The results are shown in Table 1; the relation of the deposition rate to the time is shown in FIG. 1. As shown in this figure, we find that the nitric acid-pretreated silicon wafer shows a faster deposition rate, 12.7 Å/min, than that of the others. When the silicon wafer pretreated by nitric acid and the other silicon wafer without pretreatment by nitric acid are respectively processed with the LPD-SiO$_2$ technique for one hour under the trench structure which uses Si$_3$N$_4$ as the mask, the result (as shown in FIG. 2) gives a more concrete manifestation. In FIG. 2A, the silicon wafer without pretreatment by nitric acid does not grow after deposition for one hour; on the contrary, in FIG. 2B the silicon wafer pretreated by nitric acid has obvious growth after deposition for one hour.

The relationship between the refractive index and the deposition time are shown in FIG. 3. The refractive index of the silicon wafer pre-treated by nitric acid sustains a fixed constant throughout the process. "Introduction to classical and modern optics" written by Jurgen R. Meyer-Arendt (1972) discusses the Lorentz-Lorenz relationship that shows the density and refractive index possesses some certain relation "D=Kx(n$^2$−1)/n$^2$+2)" as shown in Table 2. The silicon wafer pretreated by nitric acid sustains the same density; therefore, stress in the LPD-SiO$_2$ film is prevented. On the contrary, the wafer films deposited by other methods have much more stress inside of the SiO$_2$ film due to the large density nonuniformity.

In addition, "Field and Wave Electromagnetics" by David K. Cheng (1983) has indicated some certain relationship between the "n$_f$=($\epsilon_i$/$\epsilon_o$)$^{1/2}$", which means the lower the refractive index, the less the dielectric constant. From Table 2, we know that the refractive index of LPD-SiO$_2$ is low, so the dielectric constant of the silicon wafer pretreated by nitric acid is small. This advantage can reduce parasitic capacitance if applied to a dielectric among a multi-metal structure. Additionally, as FIG. 4(a) and FIG. 4(b) show, the LPD SiO$_2$ film grown in the three-inch wafer has very good uniformity of thickness and refractive index.

The Characteristics and Functions of this Invention

The importance of this invention is the use of a very easy pretreatment method of silicon by nitric acid to effectively deposit LPD-SiO$_2$. The features and importance of this invention are described as follows:

1. The simple pretreatment method of silicon by nitric acid can assist the growth of LPD-SiO$_2$.
2. It is not necessary to have a previous high-temperature deposited oxide film on the wafer, which makes the fabrication of an IC more flexible.
3. This method can enhance the deposition rate of SiO$_2$ and shorten the length of time of the IC fabrication process.
4. The less stress produced inside the LPD-SiO$_2$ film can increase the IC's reliability.
5. The deposited LPD-SiO$_2$ film has a smaller dielectric constant which can decrease parasitic capacitance to improve the IC speed.

Table 1 is a comparison of the five samples in the process of the growth SiO$_2$ deposition Table 2 shows the relationship between density and refractive index

BRIEF DESCRIPTION OF THE DRAWINGS

The parent file of this patent application contains at least one drawing (photograph) executed in color. Copies of the patent issuing from this application with color drawings will be provided by the Patent and Trademark Office upon request and payment of the necessary fee.

EXAMPLE 1

Figure 1:
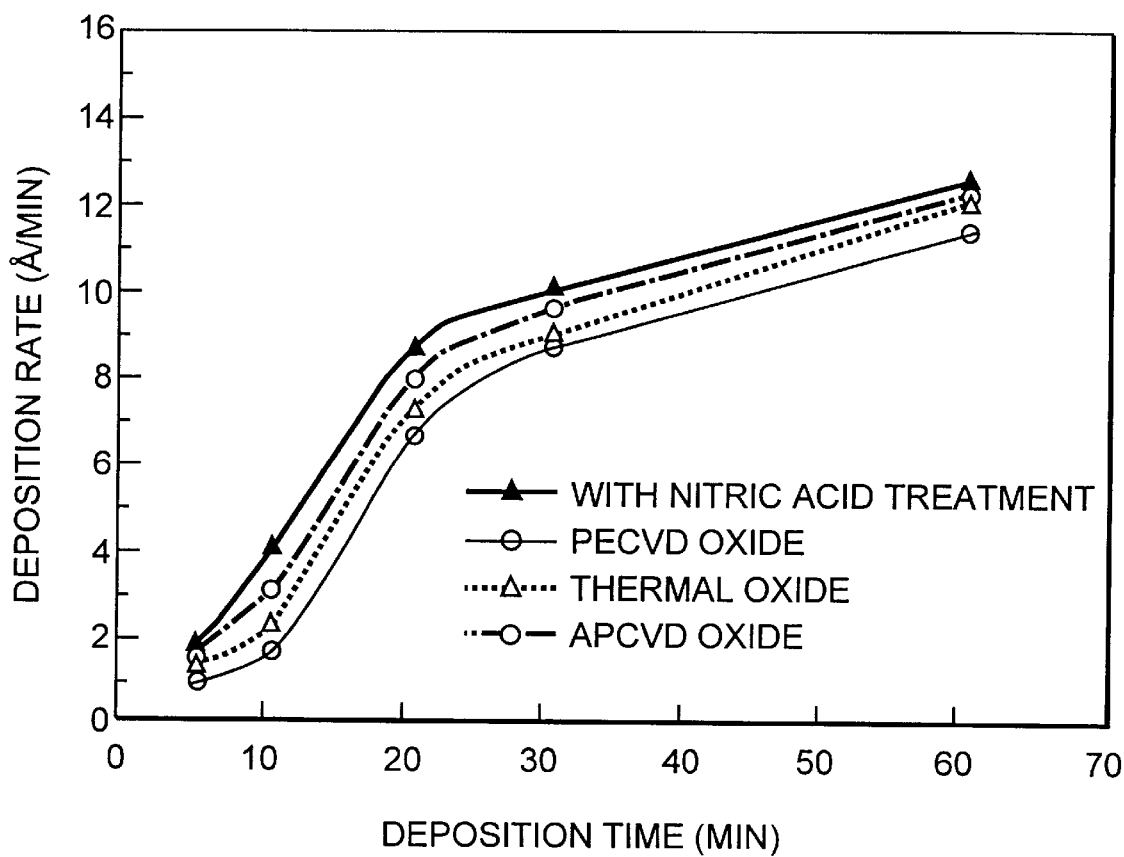
FIG. 1 Comparison of the four samples in the process of growth of LPD-SiO$_2$ film (1) silicon wafer pretreated by nitric acid (2) PECVD oxide film (3) thermal oxide film (4) APCVD oxide film FIG. 2 To process LPD SiO$_2$ film in trench structure for one hour, this trench use Si$_3$N$_4$ as a mask (a) the wafer without pretreatment by nitric acid (b) the wafer with pretreatment by nitric acid FIG. 3 The relationship between refractive index and deposition time 1. the silicon wafer pretreated by nitric acid 2. PECVD oxide film 3. thermal oxide film 4. APCVD oxide film FIG. 4 The uniformity of thickness and refractive index of a three-inch wafer (a) the distribution of thickness of LPD-SiO$_2$ film (b) the distribution of refractive index of LPD SiO$_2$ film
Figure 2:
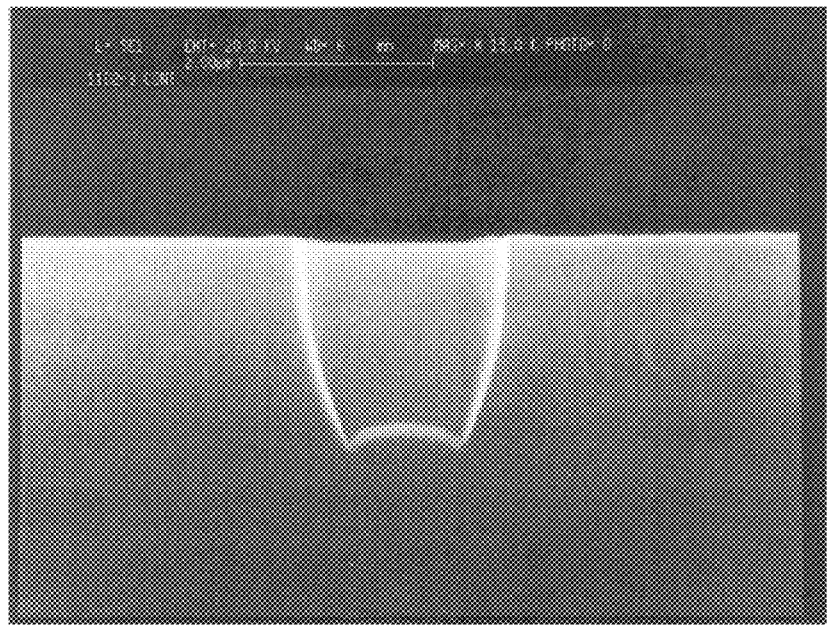
Figure 2:
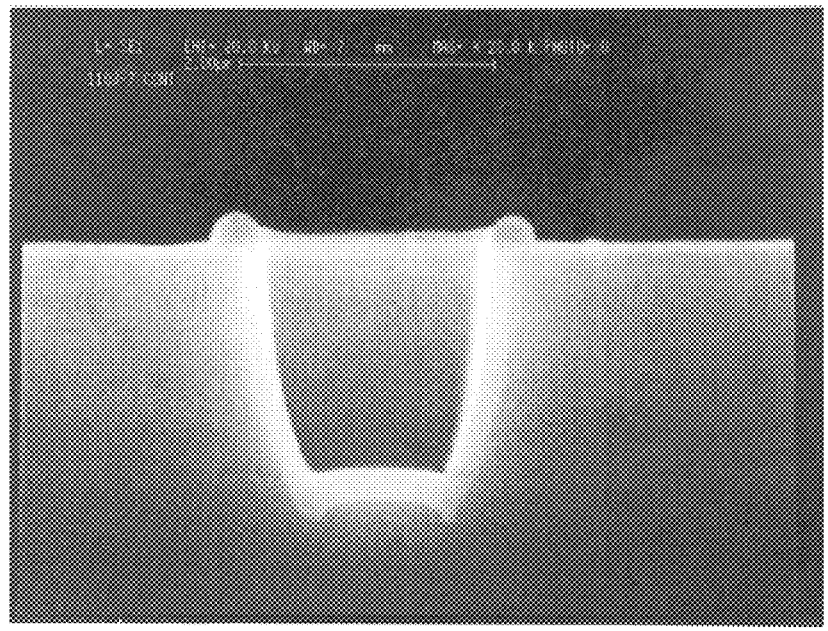
Figure 3:
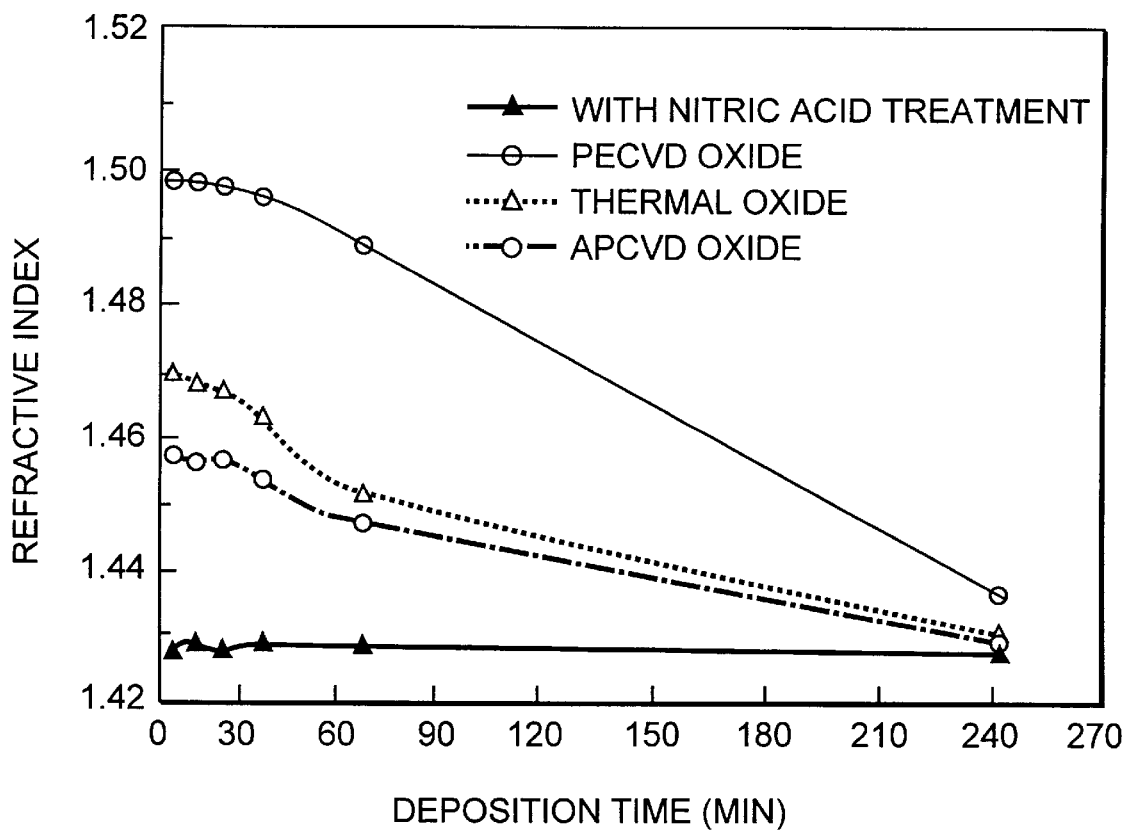
Figure 4:
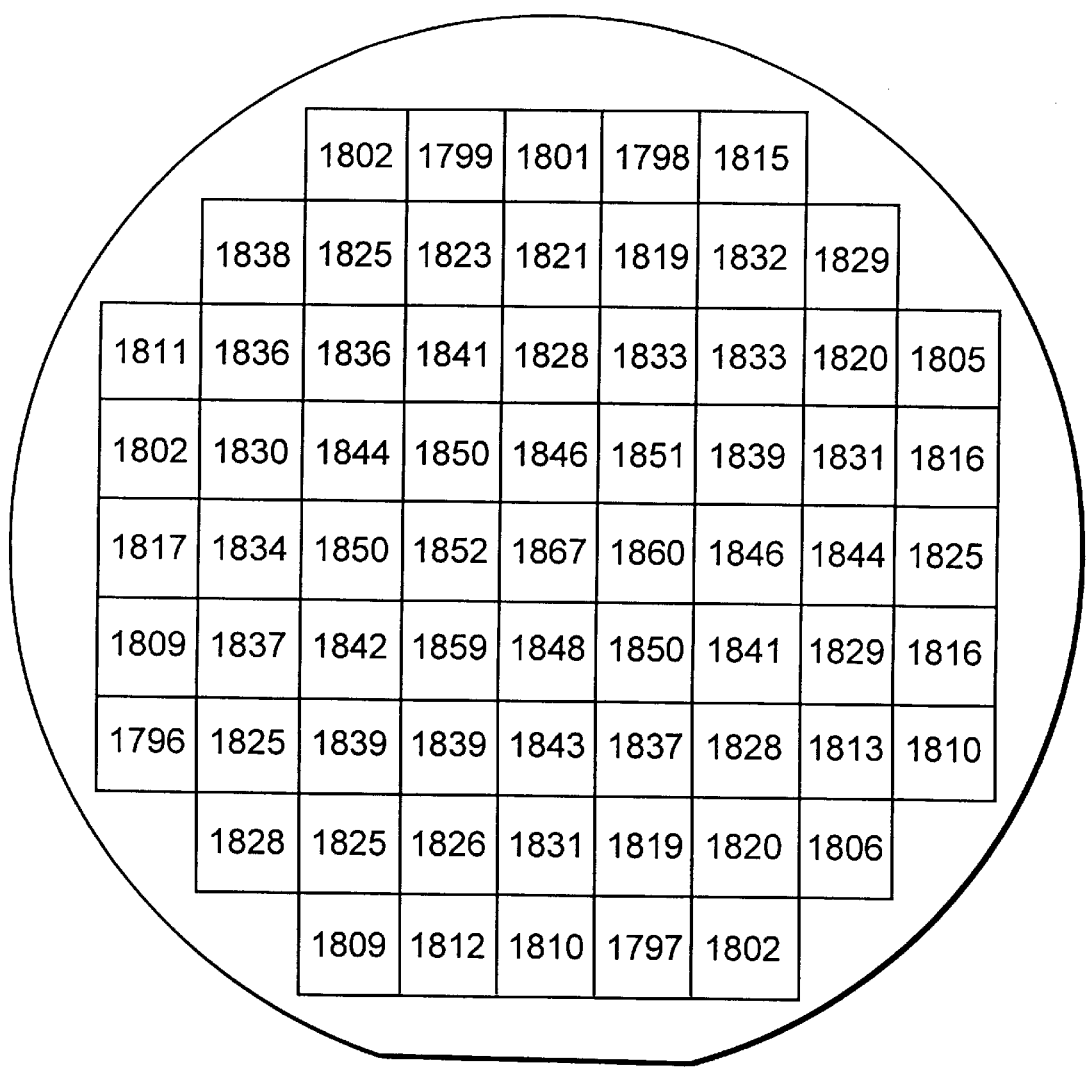
Figure 4:
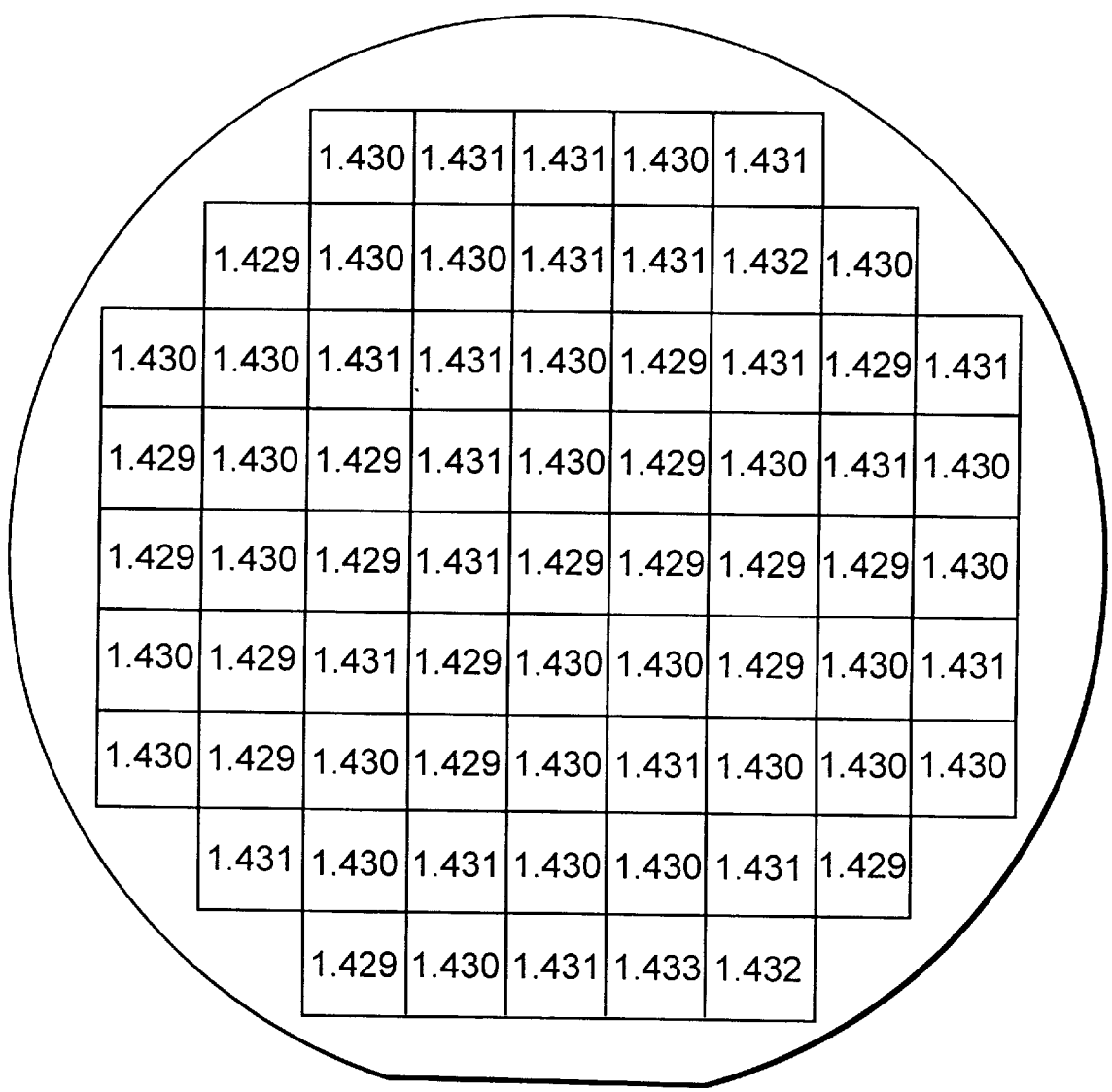

The Silicon Wafer Pretreated by Nitric Acid

First, a silicon wafer was placed into a TCE solution, and agitated with an ultrasonic wave for five minutes. After cleansing with distilled water (18 MΩ/cm), the wafer was placed in thick or concentrated sulfuric acid solution and heated for ten minutes. After this step, the wafer was cleansed with distilled water again and immersed in the hydrofluoric acid solution for one minute (HF: H$_2$O=1:10). The wafer was cleansed with distilled water again and placed in the thick or concentrated nitric acid solution to heat for three minutes. The wafer was cleansed with pure water one more time and at last the managed wafer was placed in the LPD-SiO, growth tank to grow.

EXAMPLE 2

The Silicon Wafer without Pretreatment by Nitric Acid

First, a silicon wafer is placed into the TCE solution, agitated with an ultrasonic wave for five minutes and then placed in ACE solution and agitated with an ultrasonic wave for five minutes. After cleansing with deionized water (18 MΩ/cm), this wafer was placed in thick or concentrated sulfuric acid solution for 10 minutes. After cleansing with deionized water again, the wafer was placed in hydrofluoric acid solution for one minute, cleansed with distilled water one more time, and the silicon wafer then was placed in the LPD-SiO$_2$ growth tank to grow.

TABLE 1

| Type of oxide | Refractive index | Density (g/cm) |
|---|---|---|
| thermal oxide (980° C.) | 1.470 | 2.2 [.3] |
| PECVD oxide (400° C.) | 1.498 | 2.3 [.3] |
| APCVD oxide (370° C.) | 1.456 | 2.1 [3] |
| LPD-SiO$_2$ (40° C.) | 1.428 | 2.069 [1] |

TABLE 2

| | Before deposition | | Deposition for 1 hour | | |
|---|---|---|---|---|---|
| pretreatment condition | Thickness (A) | Refractive index | Thickness (A) | Refractive index | deposition rate (A/min) |
| with nitric acid treatment | 17 | 1.427 | 779 | 1.428 | 12.7 |
| without nitric acid treatment | 0 | — | 0 | — | 0 |
| thermal oxide | 935 | 1.470 | 1674 | 1.452 | 12.3 |
| PECVD oxide | 1601 | 1.498 | 2295 | 1.489 | 11.6 |
| APCVD oxide | 1798 | 1.456 | 2548 | 1.447 | 12.5 |

What is claimed is:

1. A pretreatment method of a silicon wafer, comprising:
   cleansing a silicon wafer,
   placing said silicon wafer in an acid solution,
   heating said acid solution for about 10 minutes,
   cleansing said silicon wafer again, and
   heating said cleansed silicon wafer in heated, concentrated nitric acid solution to form a silicon wafer having a nucleation seed thereon.

2. The method as defined in claim 1
   wherein said silicon wafer having a nucleation seed is further subjected to a liquid phase oxide deposition step to form a SiO$_2$ film thereon.

3. A pretreatment method of a silicon wafer comprising placing a silicon wafer into TCE solution,
   agitating said solution containing said silicon wafer,
   removing said silicon wafer from said TCE solution,
   cleansing said silicon water with distilled water,
   placing said silicon wafer in a sulfuric acid solution,
   boiling said sulfuric acid solution containing said silicon wafer,
   removing said silicon wafer from said sulfuric acid solution,
   cleansing said silicon wafer with distilled water,
   immersing said silicon wafer in hydrofluoric acid solution,
   removing said silicon wafer from said hydrofluoric acid solution,
   cleansing said silicon water with distilled water,
   placing said silicon wafer in heated, concentrated nitric acid solution, and
   cleansing said silicon wafer with distilled water wherein said silicon wafer has a nucleation seed formed thereon.

4. The method as defined in claim 3
   wherein said pretreated silicon wafer is further subjected to a liquid phase oxide deposition step to form a SiO$_2$ film thereon.

5. A method for growing a SiO$_2$ film on a pretreated wafer comprising the pretreatment method as defined in claim 1, and further comprising
   subsequently growing a SiO$_2$ film by liquid phase oxide deposition on said pretreated silicon wafer,
   said SiO$_2$ film having a uniform thickness, a dielectric constant lower than a SiO$_2$ film prepared by thermal oxide deposition or chemical vapor deposition, and a uniform density.

6. A method for growing a SiO$_2$ film on a pretreated wafer comprising the pretreatment method as defined in claim 3, further comprising
   thereafter growing a SiO$_2$ film by liquid phase oxide deposition on said pretreated silicon wafer.

* * * * *